(12) United States Patent
Cherng

(10) Patent No.: US 6,271,117 B1
(45) Date of Patent: *Aug. 7, 2001

(54) PROCESS FOR A NAIL SHAPED LANDING PAD PLUG

(75) Inventor: George Meng Jaw Cherng, Hsinchu (TW)

(73) Assignee: Vanguard International Semiconductor Corporation, Hsin-chu (TW)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/880,952

(22) Filed: Jun. 23, 1997

(51) Int. Cl.[7] .................................................. H01L 21/4763

(52) U.S. Cl. .......................... 438/624; 438/638; 438/640; 438/739; 438/743

(58) Field of Search ..................................... 438/668, 631, 438/637, 618, 638, 624, 673, 640, 760, 756, 666, 704, 738, 739, 743

(56) References Cited

U.S. PATENT DOCUMENTS

| | | | |
|---|---|---|---|
| 4,824,767 | * 4/1989 | Chambers et al. | 430/313 |
| 5,094,900 | * 3/1992 | Langley | 428/131 |
| 5,219,791 | * 6/1993 | Freiberger | 438/640 |
| 5,234,864 | * 8/1993 | Kim et al. | 437/197 |
| 5,246,883 | * 9/1993 | Lin et al. | 438/640 |
| 5,284,799 | * 2/1994 | Sato | 438/189 |
| 5,296,400 | * 3/1994 | Park et al. | 437/52 |
| 5,374,591 | 12/1994 | Hasegawa et al. | 437/187 |
| 5,385,867 | * 1/1995 | Ueda et al. | 438/620 |
| 5,420,078 | * 5/1995 | Sikora | 438/618 |
| 5,459,100 | 10/1995 | Choi | 437/195 |
| 5,498,889 | * 3/1996 | Hayden | 257/301 |
| 5,514,624 | * 5/1996 | Morozumi | 437/195 |
| 5,567,270 | 10/1996 | Liu | 156/644.1 |
| 5,591,675 | * 1/1997 | Kim et al. | 437/195 |
| 5,683,922 | * 11/1997 | Jeng et al. | 438/41 |
| 5,723,362 | * 3/1998 | Inoue et al. | 438/190 |
| 5,770,499 | * 6/1998 | Kwok et al. | 438/253 |
| 5,804,515 | * 9/1998 | Park | 438/700 |
| 5,851,915 | * 12/1998 | Miyakawa | 438/622 |
| 5,877,092 | * 3/1999 | Lee et al | 438/738 |
| 5,935,876 | * 8/1999 | Lee et al. | 438/738 |
| 5,940,730 | * 8/1999 | Kwak et al. | 438/637 |
| 5,950,104 | * 9/1999 | Linliu | 438/640 |
| 6,060,385 | * 5/2000 | Givens | 438/626 |

* cited by examiner

Primary Examiner—Olik Chaudhuri
Assistant Examiner—Kurt Eaton
(74) Attorney, Agent, or Firm—George O. Saile; Stephen B. Ackerman; William J. Stoffel (57) ABSTRACT

The invention has two embodiments for forming a contact plug having large nail shaped landing pad. The large pad areas increase the overlay tolerances. The first embodiment comprises forming first 20 and second 24 insulating layers over a semiconductor structure. A first photoresist layer 28 with a first opening is formed over the second insulating layer 24. The second insulating layer 24 is isotropically etched using an etchant with a high selectivity thereby forming a disk shaped opening 26A. The disk shaped opening is used to define the large nail shaped landing pad. The first insulating layer 20 is etched using a dry etch thereby forming a nail shaped contact opening 26. The opening is filled with polysilicon to form the nail shaped conductive plug 36. The second embodiment begins by forming a first insulating layer 40 over a semiconductor structure. A first photoresist layer 44 with a first opening is formed over the first insulating layer 24. The first insulating layer is isotropically etched to form a half spherical hole. The first insulating layer 40 is then anisotropically etched; and forming a rounded nail shaped contact hole 50. The hole 50 is filled thereby forming the rounded nail shaped conductive plug 58.

13 Claims, 8 Drawing Sheets

PROCESS FOR A NAIL SHAPED LANDING PAD PLUG

BACKGROUND OF INVENTION

1. Field of the Invention

This invention relates generally to fabricating an interconnect for a semiconductor device and more particularly to the fabrication of a conductive plug having a large landing pad for a semiconductor device.

2. Description of the Prior Art

In the quest to achieve microminiaturization of integrated circuit devices, individual elements have been made very small and the elements have been closely packed. As devices are scaled down in dimension, there is a continuous challenge to produce smaller high density capacitors and connections to the substrate using a minimum number of process steps. For example in the recent past, integrated circuits with half a million transistors were produced with 2 micron line widths. Now, it is not uncommon to produce integrated circuits with several million transistors. As a result, conductive line widths were reduced to below 0.5 microns to attempt to maintain the overall size of integrate circuit chip. In the future, denser circuits will require that these line widths and connections must be made even smaller.

This miniaturization creates problems in photolithography alignment and in forming contacts to the substrate. Generally in the manufacturing of a (e.g., DRAM) cell of a highly integrated semiconductor device, making a storage electrode contact with a silicon substrate is a difficult process because of the precise alignment requirements of the various photolithography masks. Integrated circuit manufacturers have more difficulty aligning one feature to another and controlling tolerances as line widths decrease. For example, the alignment of the base of the bottom electrode (i.e., the plug) to the overlaying metal layer or cylindrical electrode (bottom electrode) is critical. The alignment tolerances should be increased to reduce misalignment errors and yield losses.

Others in the field have striven to solve other problems with interconnections. For example, U.S. Pat. No. 5,374,591 (Haswgawa et al.) shows a method of forming a metal plug where the adhesion layer around the via hole is removed. U.S. Pat. No. 5,459,100(Choi) shows a method of forming metal plugs in different depth holes. The patent uses two different oxide layers and etches a portion of the top oxide layer away. U.S. Pat. No. 5,567,270 (Liu) shows a method of forming plug contact with a larger top portion.

However, there is still a need for an efficient method to form a plug with a large top landing pad area.

SUMMARY OF THE INVENTION

It is an object of the present invention to provide a method for fabricating a plug (or interconnection) with a nail shaped land pad that can be used to contact the substrate or an underlying conductive layer.

It is an object of the present invention to provide a method for fabricating a plug having a large landing pad for an overlying conductive level of contact thereby reducing misalignment problems.

It is an object of the present invention to provide a method for fabricating a plug having a large landing pad thereby increasing the overlay tolerance of an overlying conductive layer to the plug landing pad.

To accomplish the above objectives, the present invention provides two preferred embodiments for manufacturing a nail shaped landing pad plug. The first embodiment (FIGS. 1A–4C) uses two insulating layers with different etch rates. A lateral portion of the top insulating layer 24 is etched to form a mold for the flat large landing pad 36. The second embodiment (FIGS. 5–8) uses one insulating layer that is etched with two etches—(1) isotropic etch and (2) anisotropic etch. The isotropic etch forms a half spherical shaped hole (e.g., bowl shaped) which is used to form the rounded head of the rounded nail shaped landing pad 58.

Figure 1A:
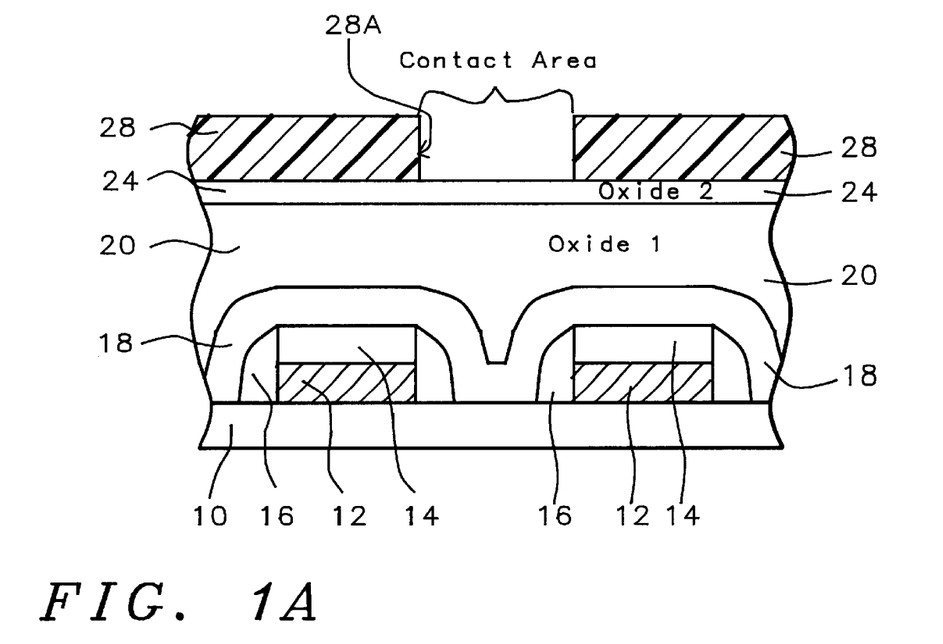
FIGS. 1A, 2A, 3A, and 4A are cross sectional views for illustrating a first embodiment of method for manufacturing a nail shaped landing pad plug according to the present invention.
Figure 1B:
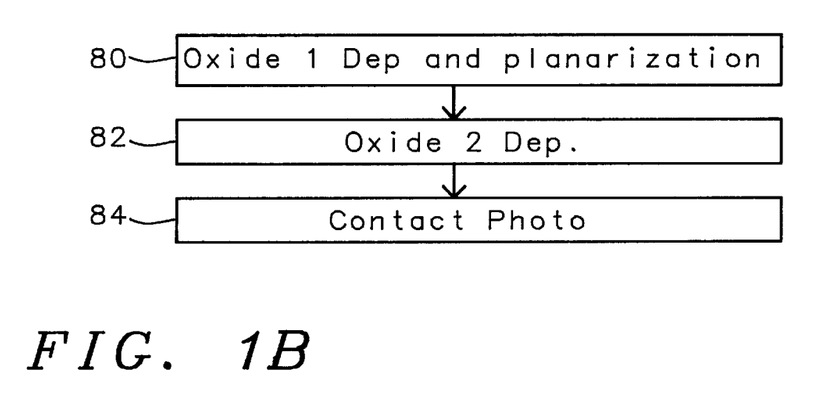
FIGS. 1B, 2B, 3B, and 4B are flow charts of the process steps performed to create the cross sectional views in FIGS. 1A, 2A, 3A and 4A for illustrating a first embodiment of method for manufacturing a nail shaped landing pad poly plug according to the present invention.
Figures 2A, 2B:
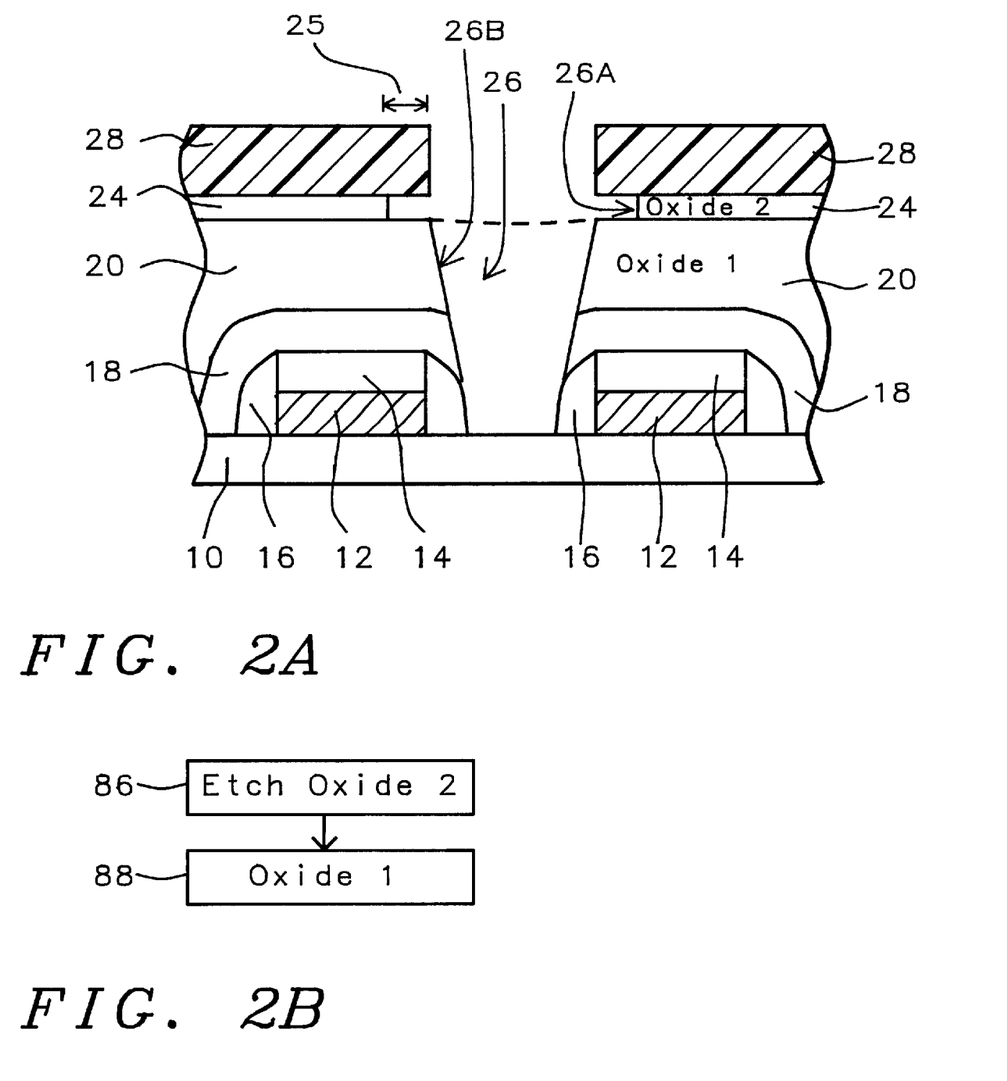
Figure 3A:
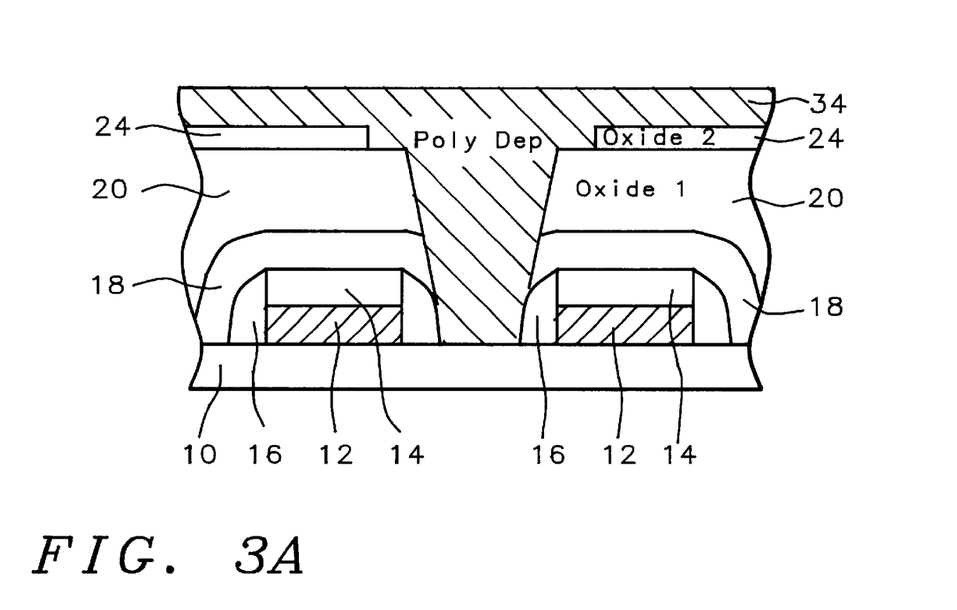
Figure 3B:
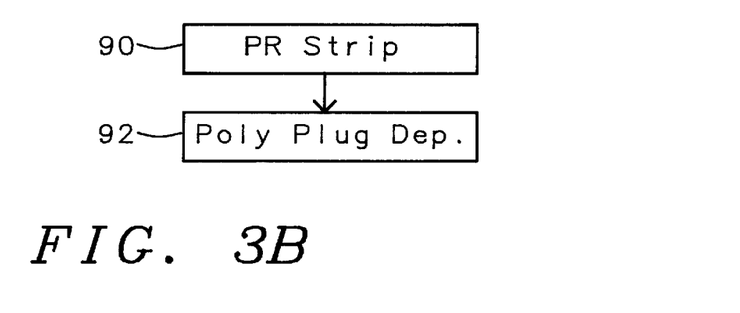
Figure 4A:
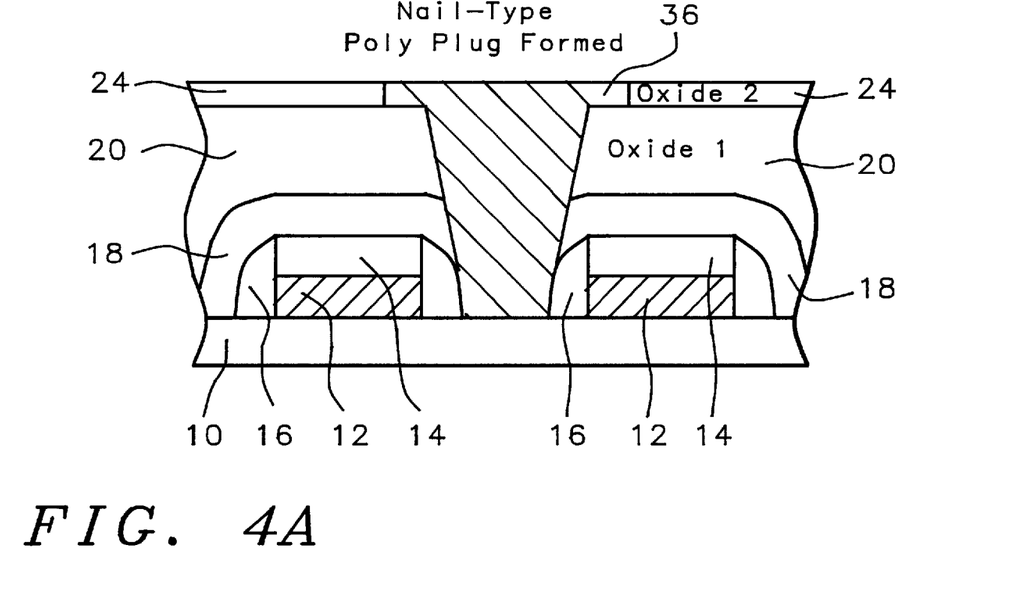
Figure 4B:
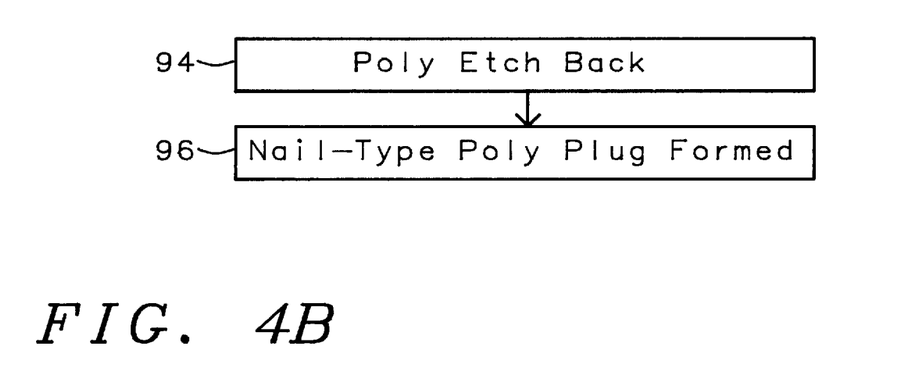

The first embodiment for manufacturing a nail shaped plug contact with a large landing pad area comprises:

a) (See FIG. 1) forming a first insulating layer 20 composed of an oxide over a contact area on a semiconductor structure;

b) forming a second insulating layer 24 composed of an oxide over the first insulating layer 20;

c) forming a first photoresist layer 28 over the second insulating layer 24; the first photoresist layer 28 having a first photoresist opening over the contact area;

d) etching the second insulating layer 24 using an isotropic etch having a selectivity in a range of between about 2:1 and 20:1 between the second insulating layer 24 and the first insulating layer 20; the isotropic etch removing a width 25 of the second insulating layer in said first photoresist opening 28A in a range of between about 0.05 and 0.3 $\mu$m;

e) etching the first insulating layer 20 using a dry etch to expose the surface of the substrate 10;

f) removing the first photoresist layer 28;

g) depositing a conductive layer 34 composed of polysilicon or a metal over the substrate surface; and h) etching back or chemical-mechanical polishing the conductive layer 34 thereby forming a nail shaped conductive plug 36.

Figure 5:
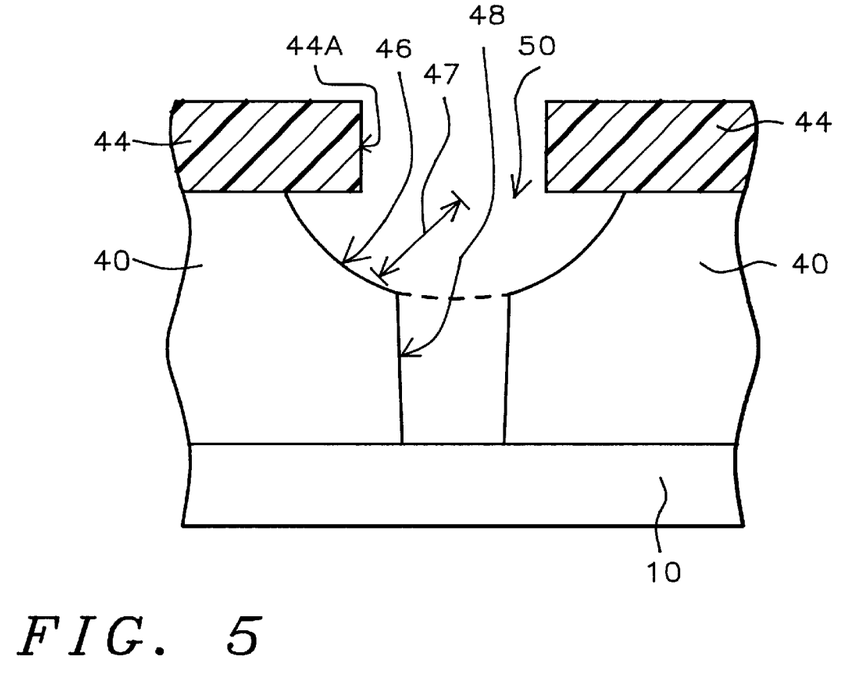
FIGS. 5 through 8 are cross sectional views for illustrating a second embodiment of method for manufacturing a rounded nail shaped landing pad poly plug according to the present invention.
Figure 7:
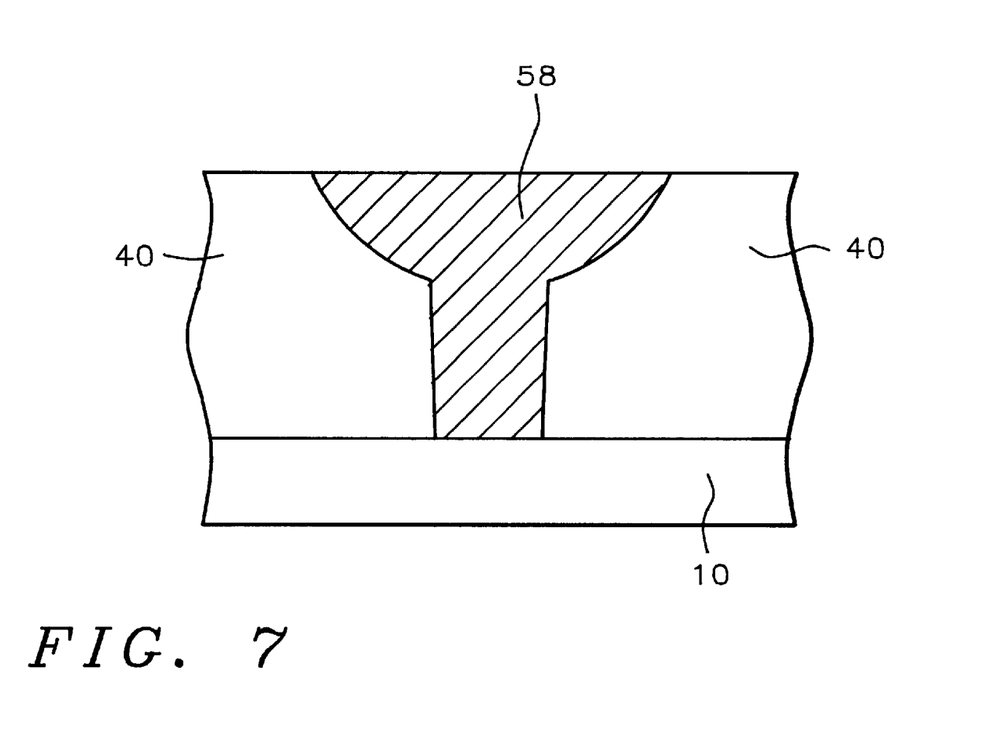

The second embodiment of the present invention forms a rounded nail shaped plug using a two step etch. The method of the second embodiment comprises:

(See FIG. 5) forming a first insulating layer 40 composed of an oxide over a semiconductor structure;

forming a first photoresist layer 44 over the first insulating layer 40; the first photoresist layer 28 having a first photoresist opening over the contact area;

performing a first etch on the first insulating layer 40 using an isotropic etch;

performing a second etch the first insulating layer 40 using an anisotropic etch exposing the surface of the substrate 10; the second etch forming a rounded nail shaped contact hole 26;

(See FIG. 6) removing the first photoresist layer 44;

(See FIG. 7) depositing a conductive layer 54 preferably composed of polysilicon filling rounded nail shaped contact hole rounded nail shaped contact hole 50 (46+48);

planarizing the conductive layer using a chemical-mechanical polish or an etchback process, thereby forming a rounded nail shaped conductive plug 58.

The present invention provides two embodiments for forming nail shaped landing pads having a large landing pad area. The large landing pad area increases the misalignment tolerances for the overlying metal contact. The two embodiments of the invention are easy to manufacture and low-cost. The invention can be used to form a connection between any two conductive layers (or substrate) with relaxed overlay tolerances.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

The present invention will be described in detail with reference to the accompanying drawings. The present invention provides a method of fabricating of a nail shaped plug of a semiconductor device. The invention can be used to form a contact between any two conductive layers such as between two metal layers or between a metal layer and the substrate. The invention has two embodiments which are explain below.

First Embodiment—Plug With a Nail Shaped Landing Pad

The method of the first embodiment is shown in FIGS. 1A to 4C. As shown in FIG. 1A, a first insulating layer 20 is formed over a semiconductor structure 10. The semiconductor structure can comprise layers and devices formed over and in a substrate. The semiconductor structure can include semiconductor devices, such as field effect transistors (FETs) that comprise gates 12, gate insulating layers 14, spacers 16, gate dielectric layers 18, etc. The substrate has a contact area 11 over an active region. The plug 36 will be formed contacting the contact area 11.

The first insulating layer 20 can be composed of a oxide, or a TEOS oxide and is more preferably composed of TetraEthylOrthoSilicate (TEOS) oxide. The first insulating layer 20 preferably has a thickness in a range of between about 1000 and 2000 Å.

Next, a second insulating layer 24 is formed over the first insulating layer 20. The second insulating layer preferably has an etch selectivity of between about 2:1 and 20:1 between the second insulating layer 24 and the first insulating layer 20 and more preferably an etch selectivity of about 10:1.

The second insulating layer 24 preferably composed f an oxide such as PE-Oxide, borophosphosilicate glass(BPSG) or hosphosilicate glass (PSG) and is more preferably composed of PE-Oxide.

The preferred combination of the first and second insulating layer and isotropic etches are shown below in table 1.

TABLE 1

Preferred combinations of the invention.

| Combination | 1$^{st}$ insulating layer 20 | 2$^{nd}$ Insulating layer 24 | Isotropic etch |
| --- | --- | --- | --- |
| 1 | TEOS | BPSG | BOE |
| 2 | TEOS | PE-Oxide | BOE or DHF |
| 3 | TEOS | PSG | BOE or DHF |

Still referring to FIG. 1A, a first photoresist layer 28 is formed over the second insulating layer 24. The first photoresist layer 28 preferably has a first photoresist opening over the contact area 11. The first photoresist opening preferably has an open dimension (e.g., diameter) in a range of between about 0.15 and 2.0 $\mu$m and more preferably between 0.15 and 0.5 $\mu$m. The first photoresist opening can have any shape, such as circular, rectangular, square or triangular, and is more preferably circular shaped.

As shown in FIG. 2A, the second insulating layer 24 is preferably etched through the first photoresist opening using an isotropic etch having a selectivity in a range of between about 2:1 and 20:1 between the second insulating layer 24 and the first insulating layer 20. The isotropic etch of the second insulating layer preferably comprises a Buffered oxide etch (BOE) or Dilute HF (DHF) and the isotropic etch removes a width 25 of the second insulating in a range of between about 0.05 and 0.3 $\mu$m. The isotropic etch forms a disk shape opening 26A (e.g., upper opening or landing pad opening) that is used to shape (e.g., mold) the large landing pad of the plug 36.

The first insulating layer 20 is then etched using a dry etch (e.g., an anisotropic etch) to expose the surface of the substrate 10. The etch forms the lower opening 26B. The combination of the upper 26A and the lower 26B opening form the nail shaped opening 26 that will be used to form the nail shaped plug. The first photoresist layer 28 is then removed.

As shown in FIG. 3A, a conductive layer 34 is deposited. The conductive layer 34 is preferably composed of polysilicon, or polysilicon and WSi and the conductive layer 34 preferably has thickness in a range of between about 1000 and 10,000 Å. The invention be used to form W, W alloy plugs, polysilicon or plugs of any conductive material.

Referring to FIG. 4A, the conductive layer 34 is planarized there by forming a nail shaped conductive plug 36. The conductive layer 34 can be planarized by a chemical-mechanical polishing (CMP) process or by an etch back process. The conductive layer is preferably planarized by an etch back process.

Figure 4C:
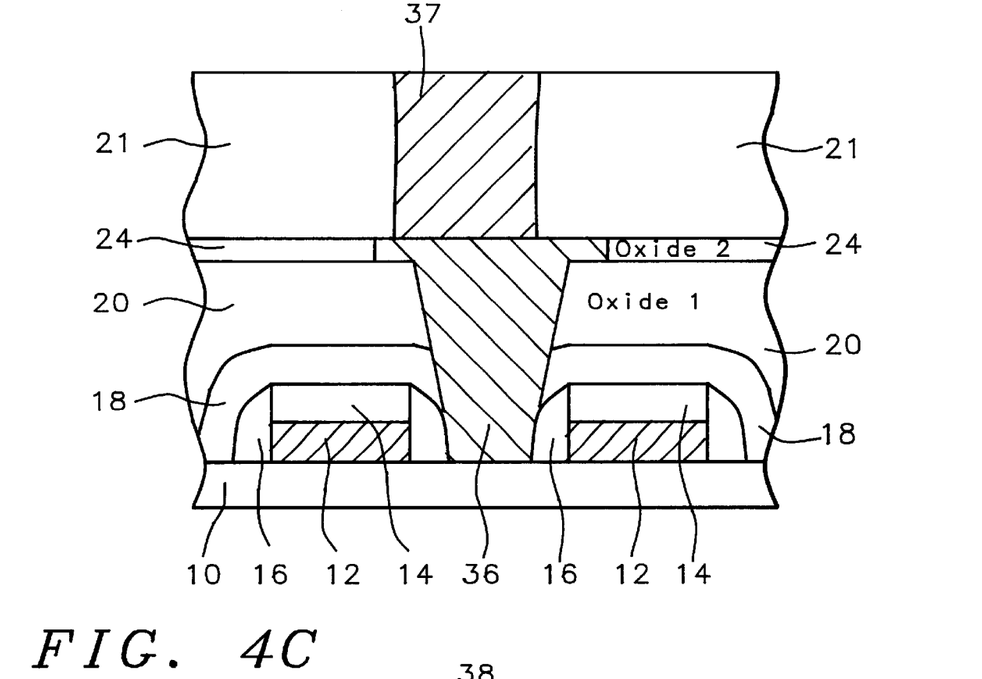
FIG. 4C is a cross sectional view for illustrating an embodiment of method for manufacturing a plug contact with nail shaped landing pad with an overlying conductive layer according to the present invention.
Figure 4D:
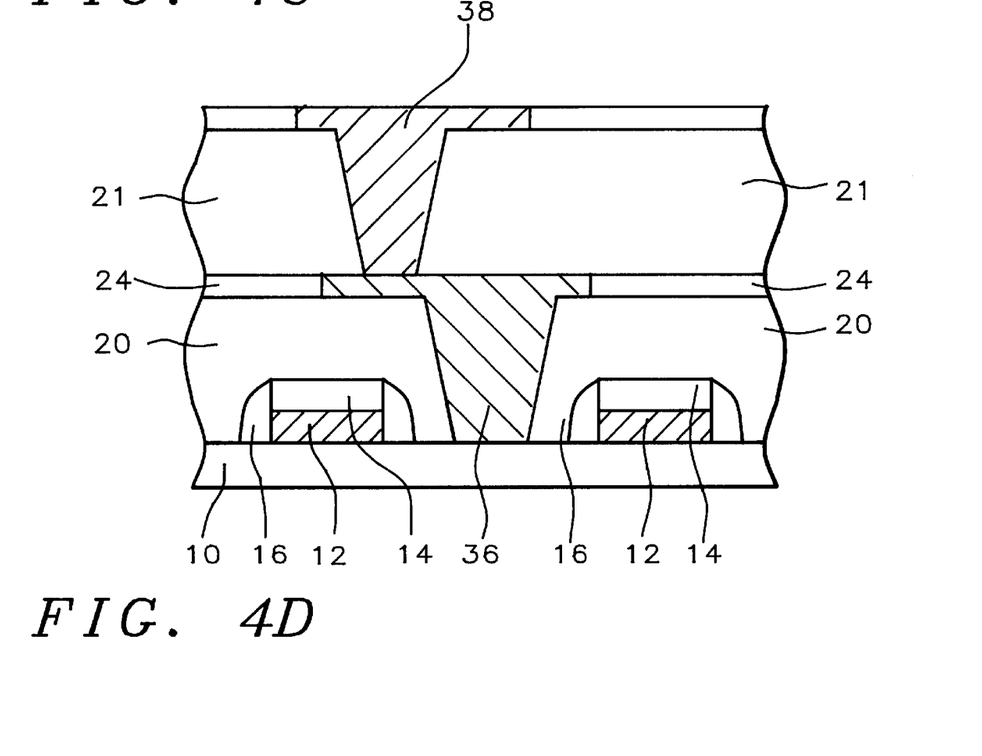
FIG. 4D is a cross sectional view for illustrating an embodiment of method for manufacturing a nail shaped landing pad plug according to the present invention where two plugs are vertically stacked.
Figure 4E:
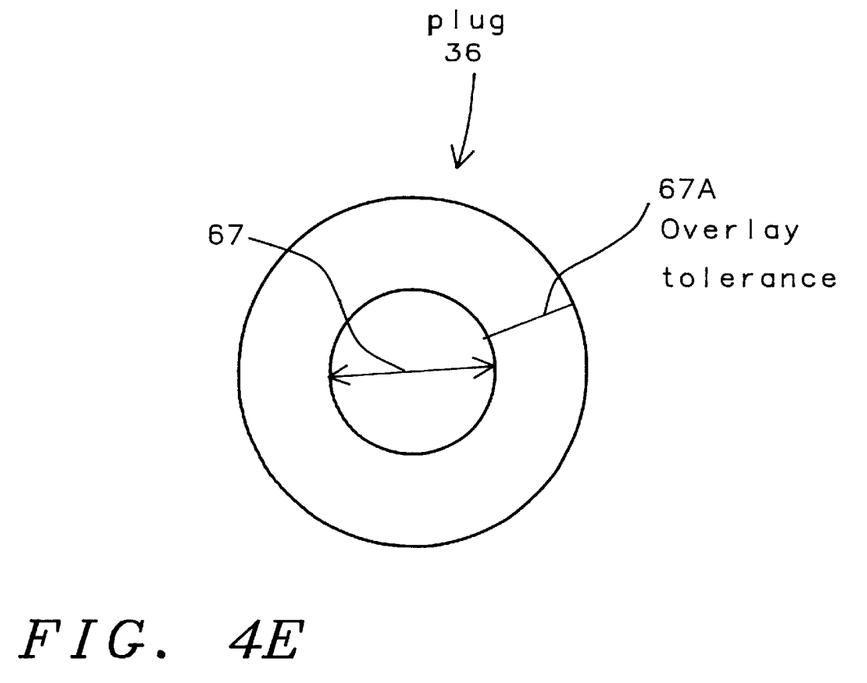
FIG. 4E is a top down representation of the landing pad of the present invention showing the invention's increased overlay tolerances.

As shown in FIG. 4E, the top landing pad of the plug 36 preferably has an top CD (Critical dimension) 67 (e.g., center hole) with an overlay tolerance 67A in a range of between about 0.05 and 0.3 $\mu$m and more preferably between about 0.08 and 0.12 $\mu$m. See FIG. 4E which is a top down view of 36.

As shown in FIG. 4C, a next overlying level of metal contact/metal layer 37 can be formed contacting the large rounded nail shaped landing pad 36 of the plug of the invention. A dielectric layer 21 is formed over the second insulating layer 24. The dielectric layer 21 is patterned. A metal layer 37 is formed contacting the large landing pad plug 36. The metal layer is then patterned. As shown in FIG. 4D, the overlying conductive layer 37 be another nail shaped landing pad plug 36 38 of the invention.

Second Embodiment—Rounded Nail Shaped Plug

The second embodiment of the invention forms a rounded nail shaped plug 58 of a semiconductor device. FIGS. 5 through 8 show the sequence of steps for the second embodiment.

Turning to FIG. 5, a first insulating layer 40 is formed over a semiconductor structure. The semiconductor structure 10 can formed over a silicon substrate. The first insulating layer 40 is preferably composed of an oxide (BPSG or undoped silicon glass (USG)) and more preferably composed of borophosphosilicate glass. A contact area where the plug will contact the substrate is preferably defined over an active region in the substrate. The contact plug 58 can be formed over a substrate or another conductive layer.

As shown in FIG. 5, a first photoresist layer 44 is formed over the first insulating layer 24. The first photoresist layer 44 has a first photoresist opening 44A over the contact area. The first photoresist opening can have any shape and preferably has a circular or rectangular shape and more preferably has a circular shape.

Still referring to FIG. 5, a first etch is performed on the first insulating layer 40 using an isotropic etch. The isotropic etch preferably comprises BOE or dilute HF (DHF). The first etch preferably removes a radius 47 of the first insulating layer 40 (in the first opening 46) in a range of between about 0.05 and 0.3 µm. The etch forms a half bowl shaped hole that is used to define the landing pad area of the rounded nail shaped plug.

FIG. 5 shows a second etch is performed on the first insulating layer 40 using an anisotropic etch. The anisotropic etch exposes the surface of the substrate 10 in the lower opening 48. The second etch forms a rounded nail shaped contact hole 50 (46 48) which is a combination of the upper bowl shaped opening 46 and the lower opening 48.

Figure 6:
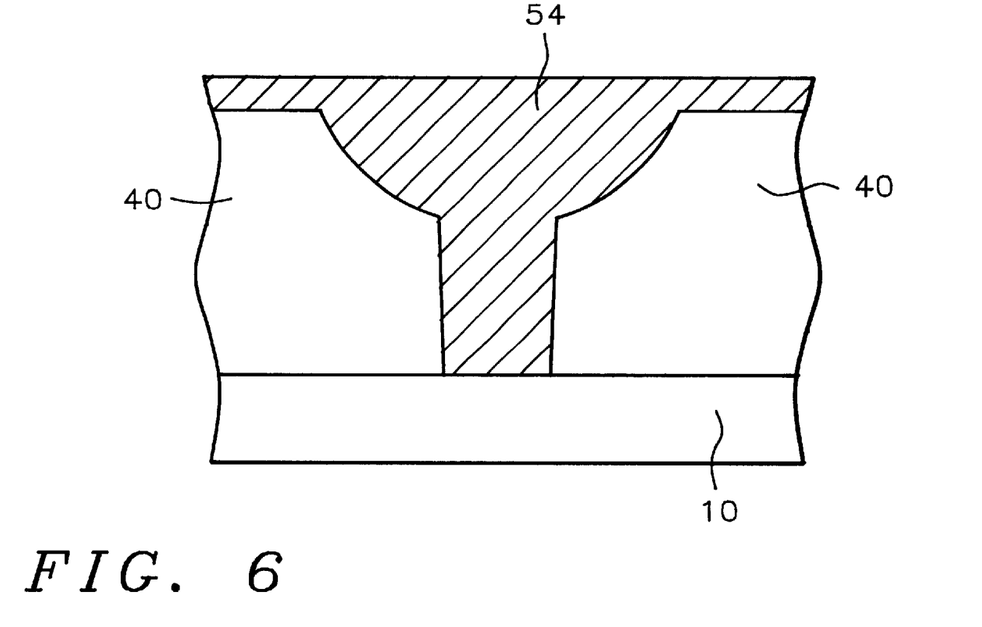

As shown in FIG. 6, the first photoresist layer 44 is then removed.

Referring to FIG. 6, a conductive layer 54 is deposited over the resultant surface filling the rounded nail shaped contact hole 50 (46+48). The conductive layer 54 is preferably composed of polysilicon, tungsten, Aluminum, or Ti/TiN.

The conductive layer 54 is preferably planarized thereby forming a rounded nail shaped conductive plug 58. The planarization of the conductive layer 54 preferably comprises chemical-mechanical polishing the conductive layer 54. Also, the planarization of the conductive layer can preferably comprise etching back the conductive layer.

Figure 8:
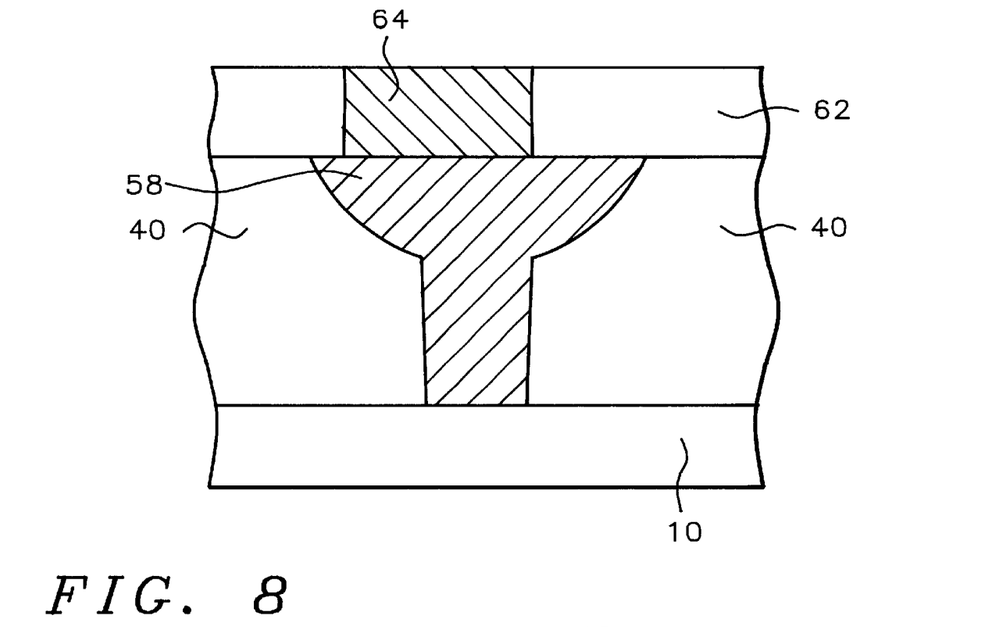

Next, as shown in FIG. 8, a conductive (e.g., metal contact/metal) layer 64 is formed contacting the large landing pad of the plug 58 of the invention. A dielectric layer 62 is formed over the first insulating layer 40. The dielectric layer is patterned. A metal layer 64 is formed contacting the large landing pad plug 58. The metal layer is then patterned.

Figure 9A:
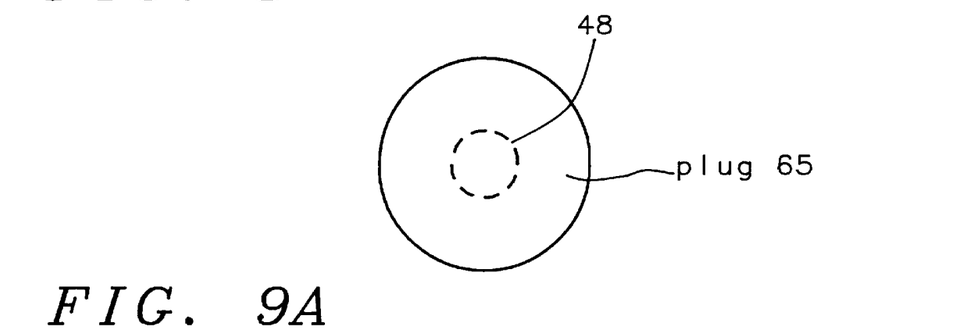
FIGS. 9A and 9B show top down views of the nail shaped plug of the first and second embodiments of the present invention.
Figure 9B:
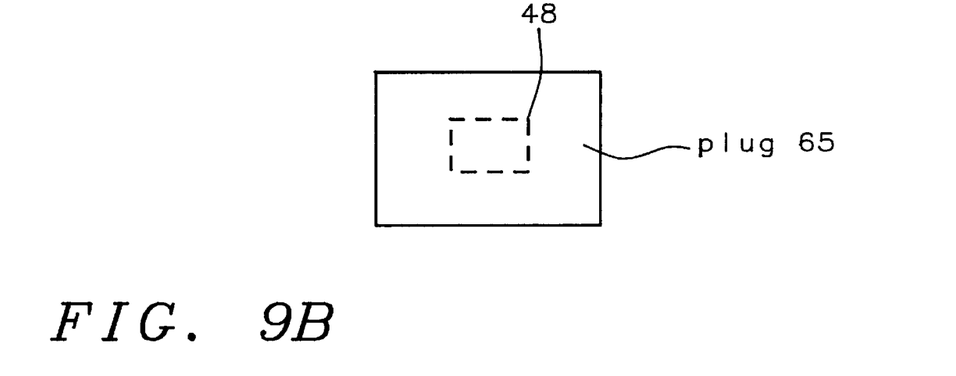

Top down views of the first and second embodiments are shown in FIGS. 9A and 9B. FIG. 9A shows a circular plug 65 (36 or 58) and FIG. 9B shows a rectangular shaped plug 65 (36 or 58). The dashed line is the lower opening 26B or 48. The plug can have any shape. This plug is preferably circular, square or rectangular shaped.

The present invention provides two embodiments for forming a nail shaped landing pad having a large landing pad area. The large landing pad area increases the misalignment tolerances for the overlying metal contact. The two embodiment of the invention are easy to manufacture and low-cost.

While the invention has been particularly shown and described with reference to the preferred embodiments thereof, it will be understood by those skilled in the art that various changes in form and details may be made without departing from the spirit and scope of the invention.

What is claimed is:

1. A method of fabricating a nail shaped plug of a semiconductor device, comprising the steps of:
   a) forming a gate and an overlying gate dielectric layer over a semiconductor structure; forming a first insulating layer over said gate dielectric layer; said first insulating layer is composed of a TEOS oxide; planarizing said first insulating layer;
   b) forming a second insulating layer on said first insulating layer; said second insulating layer is composed of a material selected from the group consisting of PSG; then
   c) forming a first photoresist layer on said second insulating layer; said first photoresist layer having a first photoresist opening over said contact area; then
   d) etching said second insulating layer using an isotropic etch forming a disk shaped opening, said disk shaped opening having flat bottom comprised of said first insulating layer; said disk shape opening having sidewalls; the isotropic etch having an etch selectivity between said second insulating layer and said first insulating layer in a range of between about 2:1 and 20:1; then
   e) etching said first insulating layer and said gate dielectric layer to form a lower opening; the etch using an anisotropic etch to expose the surface of said semiconductor structure; a nail shaped contact hole is comprised of (a) said disk shaped opening and (b) said lower opening; said lower opening having straight sidewalls; then
   f) removing said first photoresist layer; then
   g) depositing a conductive layer filling said nail shaped contact hole and overlying said second insulating layer; and
   h) planarizing said conductive layer thereby forming a nail shaped conductive plug.

2. The method of claim 1 wherein said first insulating layer has a thickness in a range of between about 1000 and 20,000 Å.

3. The method of claim 1 wherein said first photoresist opening has an open dimension in a range of between about 0.15 and 0.5µm.

4. The method of claim 1 wherein the isotropic etch of said second insulating layer comprises a buffered oxide etch and the isotropic etch removes a width of said second insulating layer in said disk shaped opening in a range of between about 0.05 and 0.3 µm.

5. The method of claim 1 wherein said conductive layer is composed of a material selected from the group consisting of polysilicon, W, Al and Ti/TiN and said conductive layer has a thickness in a range of between about 1000 and 10,000 Å.

6. A method of fabricating of a nail shaped plug of a semiconductor device, comprising the steps of:
   a) forming a gate and an overlying gate dielectric layer over a semiconductor structure; forming a first insulating layer over said gate dielectric layer; said first insulating layer composed of TEOS oxide, and has a thickness in a range of between about 1000 and 20,000 Å; planarizing said first dielectric layer;
   b) forming a second insulating layer on said first insulating layer; said second insulating layer is composed of PSG; said second insulating layer has a thickness less than 0.3 µm; then c) forming a first photoresist layer on said second insulating layer; said first photoresist layer having a first photoresist opening over said contact area; said first photoresist opening has an open dimension in a range of between about 0.15 and 0.5 µm; then d) etching said second insulating layer to form a disk shaped opening; said disk shaped opening having flat bottom comprised of said first insulating layer; said disk shaped opening having sidewalls; the etch is an isotropic etch having an etch selectivity between said second insulating layer and said first insulating layer in a range of between about 2:1 and 20:1; the isotropic etch of said second insulating layer comprising buffered oxide etch and the isotropic etch removing a horizontal width of said second insulating layer in a range of between about 0.05 and 0.3 µm; then e) etching said gate dielectric layer and said first insulating layer to form a lower opening; the etch using a dry etch to expose the top surface of said semiconductor structure; a nail shaped contact hole comprised of (a) said disk shaped opening and (b) said lower opening; said lower opening having straight sidewalls;

f) removing said first photoresist layer; then g) depositing a conductive layer filling said nail shaped contact hole and overlying said second insulating layer; said conductive layer is composed of a material selected from the group consisting of polysilicon, W, Al and Ti/TiN, and said conductive layer has a thickness in a range of between about 1000 and 10,000 Å; and h) etching back said conductive layer thereby forming a nail shaped conductive plug.

7. The method of claim 6 wherein said semiconductor structure is formed over a substrate; said substrate having a contact area over an active region; the bottom of said nail shaped conductive plug contacts said active region in said substrate.

8. The method of claim 6 wherein the top of said nail shaped conductive plug has an area in a range of between about 0.03 and 0.3 µm².

9. A method of fabricating a nail shaped plug of a semiconductor device, comprising the steps of:

a) providing a metal layer over a semiconductor structure; forming a first insulating layer over said metal layer and said semiconductor structure;

b) forming a second insulating layer on said first insulating layer; said second insulating layer is composed of PSG; then c) forming a first photoresist layer on said second insulating layer; said first photoresist layer having a first photorestist opening over a contact area; then d) etching said second insulating layer using an isotropic etch forming a disk shaped opening, said disk shaped opening having flat bottom comprised of said first insulating layer; said disk shaped opening having sidewalls; the isotropic etch having an etch selectivity between said about 2:1 and 20:1; then e) etching said first insulation layer to form a lower opening; the etch using a anisotropic etch to expose the surface of said metal layer forming a nail shaped contact hole is comprised of (a) said disk shaped opening and (b) said lower opening; said lower opening having straight sidewalls; then f) removing said first photoresist layer; then g) depositing a conductive layer filling said nail shaped contact hole and overlying said second insulating layer; and h) planarizing said conductive layer thereby forming a nail shaped conductive plug.

10. A method of fabricating a nail shaped plug of a semiconductor device, comprising the steps of:

a) forming a first insulating layer over a semiconductor structure;

b) planarizing said first insulating layer;

c) forming a second insulating layer on said first insulating layer; said second insulating layer is composed of PSG;

d) forming a first photoresist layer on said second insulating layer; said first photoresist layer having a first photoresist opening over said contact area; then e) etching said second insulating layer using an isotropic etch forming a disk shaped opening, said disk shaped opening having flat bottom comprised of said first insulating layer; said disk shaped opening having vertical sidewalls; then f) etching said first insulating layer using a anisotropic etch to expose the surface of said semiconductor structure to form a lower opening; said lower opening and said disk shape opening comprise a nail shaped contact hole; then g) removing said first photoresist layer;

h) depositing a conductive layer filling said nail shaped contact hole and overlying said second insulating layer; and i) planarizing said conductive layer thereby forming a first nail shaped conductive plug;

j) forming a third insulating layer on said first nail shaped conductive plug and said second insulating layer;

k) forming a fourth insulating layer on said third insulating layer; said fourth insulating layer composed of PSG;

l) forming a second photoresist layer on said fourth insulating layer; said second photoresist layer having a second photoresist opening over said first nail shaped conductive plug; then m) etching said fourth insulating layer using an isotropic etch forming a second disk shaped opening, said second disk shaped opening having flat bottom comprised of the planarized said first insulating layer; said second disk shaped opening has sidewalls; then n) etching said third insulating layer using an anisotropic etch to expose the surface of said first nail shaped conductive plug forming a second lower opening; a second nail shaped contact hole is comprised of said second lower opening and said second disk shaped opening; said second lower opening have flat sidewalls; then o) removing said second photoresist layer; then p) depositing a second conductive layer filling said second nail shaped contact hole and overlying said fourth insulating layer; and q) planarizing said second conductive layer thereby forming a second nail shaped conductive plug.

11. The method of claim 1 wherein said second insulating layer has a thickness less than 0.3 µm.

12. The method of claim 9 wherein said second insulating layer has a thickness less than 0.3 µm.

13. The method of claim 10 wherein said second insulating layer has a thickness less than 0.3 µm.

* * * * *